United States Patent [19]

Takashi et al.

[11] 4,096,576

[45] Jun. 20, 1978

[54] ANALOGUE FILTER SYSTEMS

[75] Inventors: Sakurai Takashi, Musashino; Matsuo Tadayuki; Takahashi Koro, both of Sendai, all of Japan

[73] Assignee: Fukuda Denshi Co., Ltd., Tokyo, Japan

[21] Appl. No.: 748,311

[22] Filed: Dec. 7, 1976

[30] Foreign Application Priority Data

Dec. 11, 1975 Japan .............................. 50-147855

[51] Int. Cl.$^2$ ..................... G06J 1/00; G06G 7/625; H04B 15/00
[52] U.S. Cl. ..................................... 364/602; 325/65; 328/167; 333/18; 364/825
[58] Field of Search ................. 235/150.5, 150.53, 193, 235/181, 156, 152; 328/167; 325/42, 65; 333/18, 28 R, 70 T

[56] References Cited

U.S. PATENT DOCUMENTS

| | | |
|---|---|---|
| 3,515,990 | 6/1970 | Robertson .................. 235/156 UX |
| 3,629,509 | 12/1971 | Glaser ........................ 235/156 UX |
| 3,639,848 | 2/1972 | Elliott ............................... 328/167 |
| 3,912,916 | 10/1975 | Grün et al. .................. 328/167 X |
| 3,999,129 | 12/1976 | Kasson ............................. 325/42 |

*Primary Examiner*—Joseph F. Ruggiero
*Attorney, Agent, or Firm*—Spensley, Horn & Lubitz

[57] ABSTRACT

The analogue filter system is constituted by first and second analogue filters having similar characteristics, a delay device connected between the first and second analogue filters and controlled by a timing circuit for storing the output of the first analogue filter and for producing an output with its time axis inverted, and a device for restoring the time axis of the output from the delay device.

11 Claims, 45 Drawing Figures

FIG.1
(PRIOR ART)
(a) INPUT 
(b) 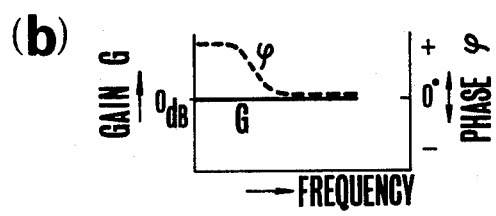 
PHASE DISTORTION
(LEADING)
(c) 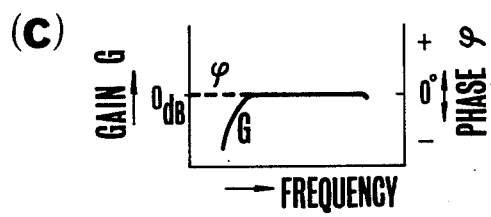 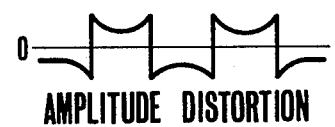
AMPLITUDE DISTORTION
(d) 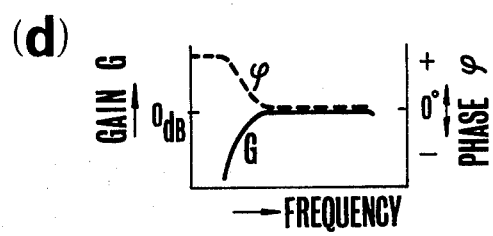 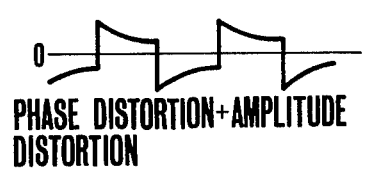
PHASE DISTORTION+AMPLITUDE
DISTORTION FIG.2
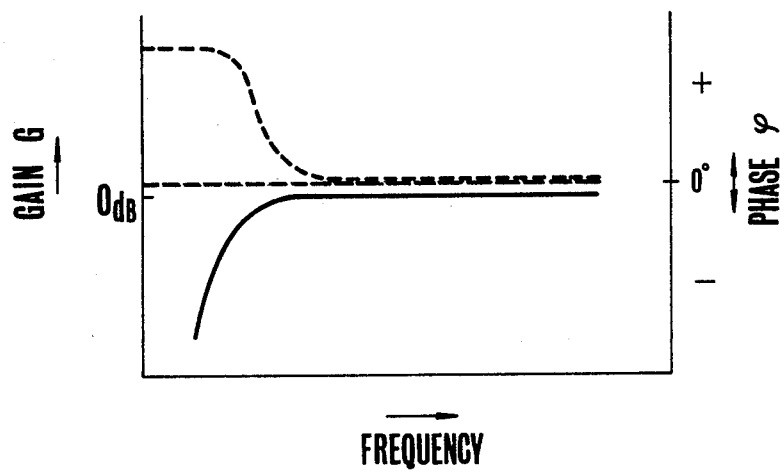
FIG.3
(a) 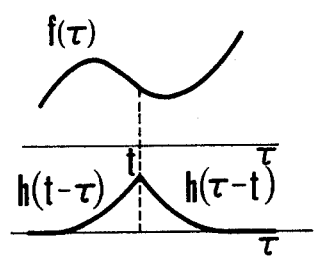  (b) 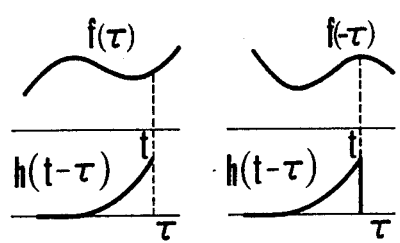

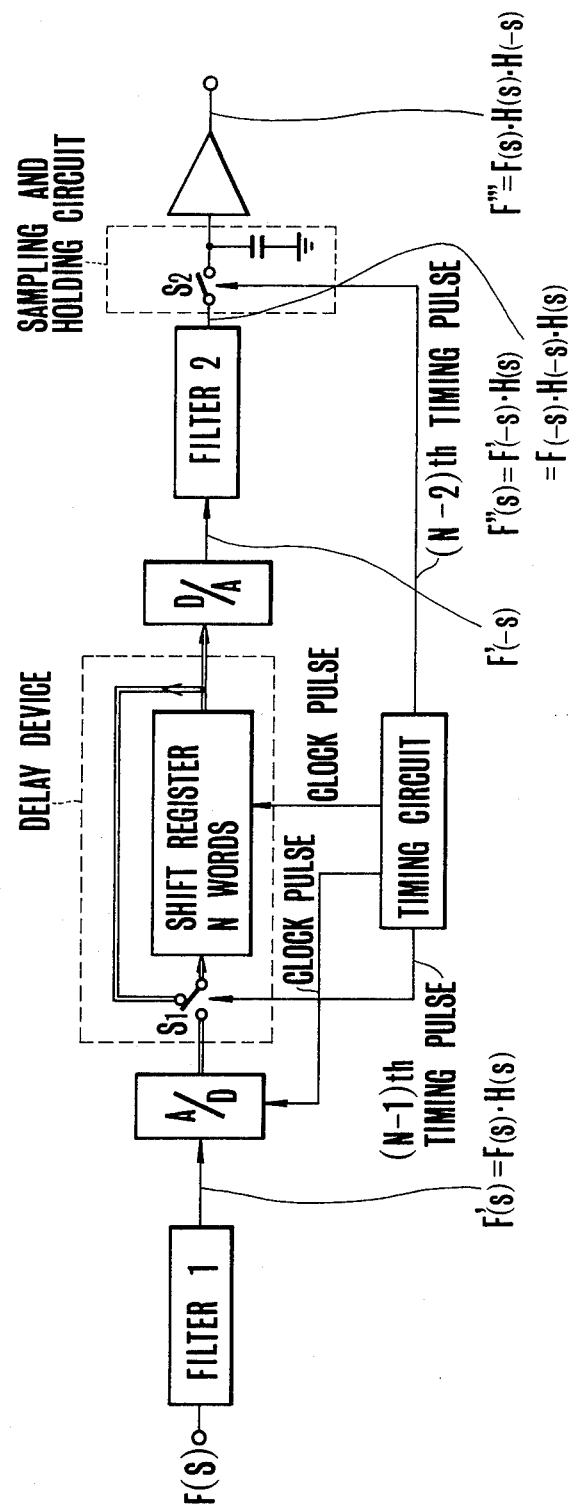
F I G. 5

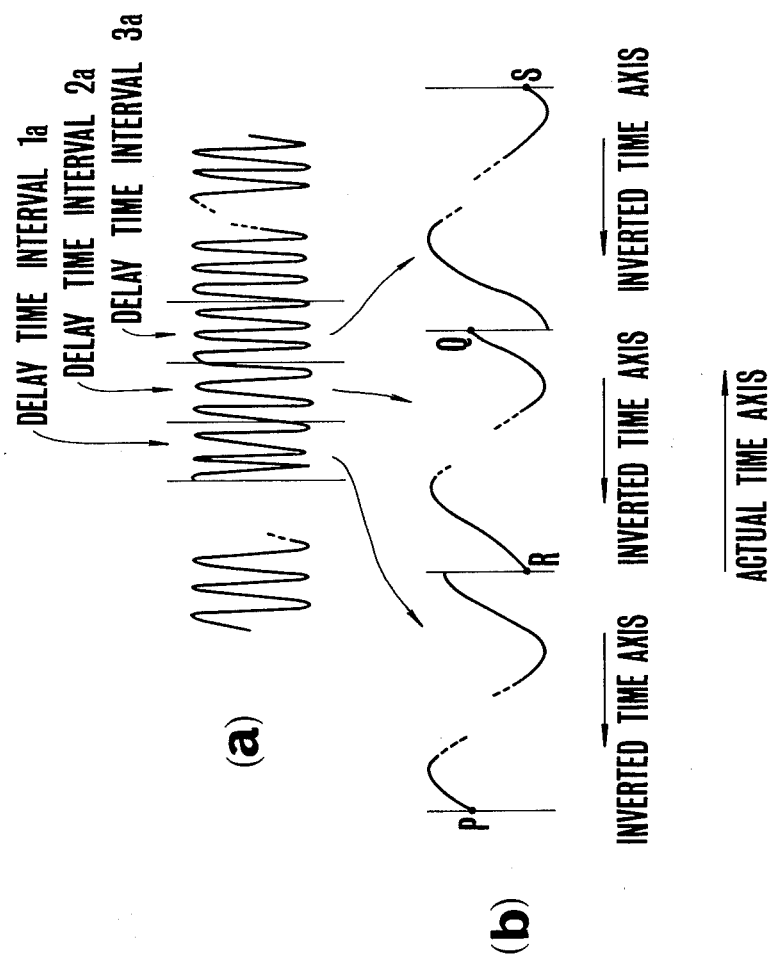

ANALOGUE FILTER SYSTEMS

BACKGROUND OF THE INVENTION

This invention relates to an analogue filter system and more particularly to a novel analogue filter system capable of effecting a continuous real time processing of an analogue signal without any phase distortion.

Fluctuation of the base line of an analogue signal such as a biological signal, especially a cardiogramic signal, has difficulties with the recording, display or processing of a cardiogram so that it is necessary to eliminate such fluctuation.

The fluctuation of the base line is caused mainly by the polarization voltage of the induction electrode so that elimination of the polarization voltage is the most efficient solution for stabilizing the base line. However, any effective solution has not yet been made.

In electric circuits, various countermeasures for stabilizing the base line have been proposed including a method of eliminating the fluctuating component by an analogue filter, and a method wherein the fluctuating component is detected by an analogue filter and the fluctuating component is subtracted from the original signal. However, when a signal is passed through an analogue filter, the phase of the signal is distorted greatly owing to the phase shift caused by the filter, especially due to a rapid phase variation near the cut off frequency, thus making it difficult to obtain a stable base line. Although a logical filter provided by an electronic computer has been used to eleminate the phase distortion, such a method is not only expensive but also requisite for a large number of multiplying operations for each point, hence a long operation time especially at low cut off frequencies, so that it is difficult to perform a real time processing with a miniature computer.

However, since, in many applications, the biological signals are processed by an electronic computer, the analogue filter is required to be able to continuously perform the desired real time processing of the analogue signal.

SUMMARY OF THE INVENTION

Accordingly, it is an object of this invention to provide an improved analogue filter system capable of stabilizing the base line of an analogue signal. More specific object of this invention is to provide a novel analogue filter system capable of effecting a continuous real time processing of an analogue signal without any phase distortion (hereinafter referred to as a phase distortion free analogue filter system).

According to one aspect of this invention there is provided an analogue filter system comprising a first analogue filter connected to an input terminal for receiving an input analogue signal, a second analogue filter having similar characteristics to the first analogue filter, delay means connected between the first and second analogue filters for storing the output from the first analogue filter and for producing an output with the time axis thereof inverted under the control of a timing circuit, and means for restoring the inverted axis of the output, whereby an output analogue signal is produced which is delayed in relation to the input analogue signal but free from any phase distortion.

According to another aspect of this invention there is provided an analogue filter system comprising an input terminal for receiving an input analogue signal, a first analogue filter channel including means for inverting and condensing the time axis of the input analogue signal, a second analogue filter channel connected in parallel with the first analogue filter channel and including means for delaying the input analogue signal, an adder for adding the outputs from the first and second analogue filter channels with each other, and a sampling and holding circuit connected to the output of the adder for restoring the time axis thereof.

According to still another aspect of this invention there is provided an analogue filter system comprising an analogue input terminal; a single A-D converter connected to said analogue input terminal; a first channel including means for inverting and condensing the digital output from the A-D converter; a second channel connected in parallel with the first channel and including means for delaying the digital output of the A-D converter; a first analogue filter channel including holding means corresponding to the first channel; a second analogue filter channel including holding means corresponding to the second channel; a single D-A converter; switching means for alternately connecting the D-A converter between the first channel and the first analogue filter channel and between the second channel and the second analogue filter channel; an adder for adding with each other the outputs of the first and second analogue filter channels; and a sampling and holding circuit connected to the output of the adder for restoring the time axis of the analogue signal.

BRIEF DESCRIPTION OF THE DRAWINGS

Further objects and advantages of the invention can be more fully understood from the following detailed description taken in conjunction with the accompanying drawings, in which:

FIGS. 1a through 1d are graphs showing the relationship between the signal transmission characteristic and the waveform distortion of a prior art analogue filter;

FIG. 2 shows a Bode diagram of an analogue filter system of this invention;

FIGS. 3a and 3b are graphs showing the impulse response of the transmission function of the analogue filter system of this invention and the input signal waveform;

FIG. 5 is a block diagram showing the basic conception of one embodiment of this invention;

FIGS. 7 and 10 show the details of the circuits utilized in the embodiment shown in FIG. 4 in which FIG. 7 shows a first filter and a A-D converter; FIG. 10 an oscillator and counter unit and a driver unit;

FIGS. 14a and 14b are waveforms useful to explain the outputs of the D-A converter unit shown in FIG. 8;

DESCRIPTION OF THE PREFERRED EMBODIMENTS

Figure 4:
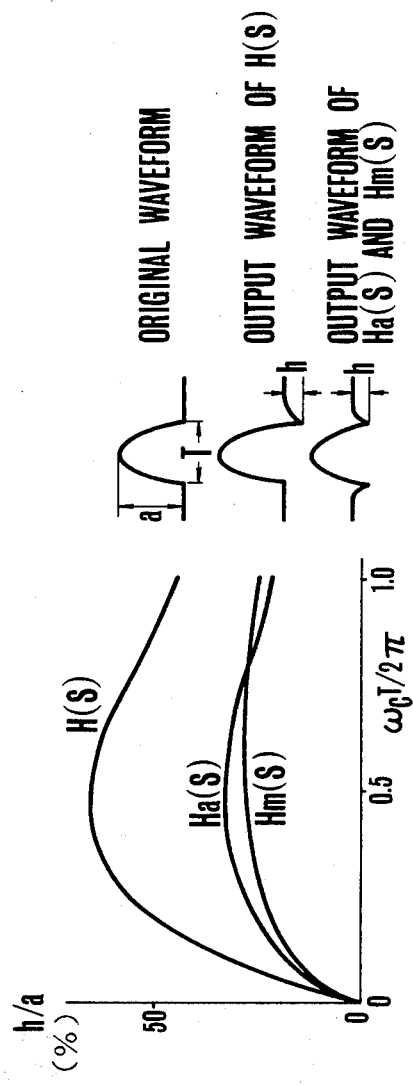
FIG. 4 is a graph comparing the waveform distortion of a prior art high pass analogue filter with that of a high pass analogue filter system embodying the invention.

As shown in FIG. 1, the waveform distortion of a signal during transmission through a linear circuit such as a conventional analogue filter can generally be classified into amplitude distortion and phase distortion. The amplitude distortion is caused by the amplitude attenuation of the signal at a certain frequency whereas the phase distortion is caused by the phase shift of the signal at a certain frequency.

Where a rectangular waveform input is applied as shown in FIG. 1a, FIG. 1b shows a case where the gain is constant and certain phase shift appears, whereas FIG. 1c shows an ideal case wherein the amplitude of the signal attenuates at a low frequency range but the phase of the signal is constant. FIG. 1d shows an ordinary linear transmission characteristic which is the typical one of the conventional linear analogue filter. Accordingly, the response waveform is subjected to the phase distortion and the amplitude distortion.

The phase distortion free analogue filter system of this invention has characteristics shown by a solid line (gain) and chained lines (phase) as shown by the Bode diagram shown in FIG. 2. Accordingly, a signal passing through this analogue filter system will not be subjected to the phase distortion at a low frequency range different from the prior art analogue filter having a characteristic as shown by dotted lines shown in FIG. 2.

In order to construct a phase distortion free analogue filter system by using analogue filters each having a transmission function H(S), where S represents a Laplace operator, it is necessary to synthesize the analogue filters such that the transmission function of the analogue filter system will be an even function. There are two methods of the synthesis as follows:

$$Ha(S) = \tfrac{1}{2}\{H(S) + H(-S)\} \quad (1)$$

$$Hm(S) = H(S) \cdot H(-S) \quad (2)$$

Equation (1) means that the impulse response $h(\tau)$ of the transmission function H(S) is subjected to a convolution with a signal $f(\tau)$ on both sides of the impulse response with respect to time $t$, as shown in FIG. 3a. Such Ha(S) is herein called the synthesis of an additive type.

According to equation (2), the output F'(S) from an analogue filter becomes $$F'(S) = F(S) \cdot H(S) \quad (3),$$

where F(S) represents the input signal, and when the time axis of the output F'(S) is inverted and the signal is passed again through another analogue filter having the same characteristic, the output F''(S) from the latter analogue filter is expressed by $$F''(S) = F'(-S) \cdot H(S) = F(-S) \cdot H(-S) \cdot H(S) \quad (4)$$

When restoring the time axis of the output signal F''(S) thus obtained, the final output F'''(S) will be expressed by $$F'''(S) = F(S) \cdot H(S) \cdot H(-S) \quad (5)$$

Thus, it will be clear that the overall transmission function is equal to that expressed by equation (2).

The impulse reponse $h(\tau)$ of the signal and the time relationship of signal $f(\tau)$ that is the convolution in this case is shown in FIG. 1b. This Hm(S) is hereinafter called the synthesis of a product type. For the purpose of investigating the phase characteristic, let us put $$H(S) = H(\omega)$$

$$S = J\omega$$

then we obtain $$H(\omega) = |H(\omega)| e^{j\theta(\omega)} \quad (6)$$

In the case of the additive type, we obtain a synthetic even function expressed by $$Ha(\omega) = \tfrac{1}{2}\{|H(\omega)| e^{j\theta(\omega)} + |H(\omega)| e^{-j\theta(\omega)}\}$$
$$= |H(\omega)| \cos \theta(\omega) \quad (7)$$

In the case of the produce type, we obtain a synthetic even function expressed by $$Hm(\omega) = |H(\omega)| e^{j\theta(\omega)} \times |H(\omega)| e^{-j\theta(\omega)} = |H(\omega)|^2 \quad (8)$$

As can be noted from these equations, in the case of Ha(ω) the sign and magnitude of the amplitude of H(ω) vary in accordance with a cosine but there is not term of $e^{j\theta}(\omega)$ so that there is no effect of the phase. On the other hand, Hm(ω) always has a positive value and the effect of the phase of H(ω) is nullified.

In the case of Ha(S), the phase of H(ω) has an influence upon the sign and amplitude of Ha(ω). This means that Ha(S) has a zero point but Hm(S) does not.

To render the filter system free from any phase distortion, H(S) may assume any function. In other words, the filter system may be a low pass filter, a high pass filter or a bandpass filter.

FIG. 4 shows examples of waveform distortion of one half cycle of a sine wave obtained by using a quadratic high pass filter H(S) having a cut off frequency of $\omega_c$ and specifically expressed as, $$H(S) = (S/S + \omega_c)^2 \quad (8)$$

a filter system having an additive transmission function Ha(S) synthesized by these quadratic H(S) filters according to equation (1), and another filter system having a product transmission function Hm(S) synthesized by these quadratic H(S) filters according to equation (2), respectively. The amount of distortion is expressed by a value $h/a$ shown on the righthand side of FIG. 4.

From FIG. 4 it can be clearly noted that the distortion (of amplitude) of $Hm(S)$ is smaller than that of $Ha(S)$ but these distortions are considerably smaller than a conventional analogue filter, and that this relationship holds generally.

The construction of the phase distortion free analogue filter system embodying the principle described above may take various forms. But the construction of the filter system of product type can be made relatively simple because the synthesis of the transmission functions of the product type can be done be serially connecting two filters each having a transmission function $H(S)$.

As diagrammatically shown in FIG. 5, a phase distortion free analogue filter system of the produce type can be constituted by serially connecting a linear type filter 1, an A-D converter, an N word shift register whose content is shifted by a clock pulse from a timing circuit, a delay device including switch means $S_1$ switched by an $(N-1)$th timing pulse, a D-A converter, a linear filter 2, and a sampling and holding circuit including switch means $S_2$ operated by an $N-2)$th timing pulse from the timing circuit and a capacitor. Assuming now that an input signal is denoted by $F(S)$, and that the transmission functions of filters 1 and 2 by $H(S)$ (provided that filter 2 has a cut off frequency characteristic of N times of that of filter 1), the various portions of the signal are as shown by the equations shown in FIG. 5.

More particularly, the input signal $F(S)$ passed through filter 1 having the transmission function $H(S)$ is subjected to A-D conversion in synchronism with the N work shift register. The switch means $S_1$ is normally thrown to a position in which the input and output of the N word shift register are short-circuited so that the content of the shift register is circulated or delayed by the clock pulse. However, at (N-1)th clock pulse, the switch $S_1$ is thrown to the output side of the A-D converter so that the A-D converted digital signal will be written into the N word shift register at a timing of (N-1)th clock pulse. Consequently, as will be described in detail later, the time axis of the output signal from the shift register is reversed within every delay time interval. Thereafter the output of the shift register is subjected to a D-A conversion. Since the duration of the D-A converted output is condensed by N, where N represents the bit of the shift register, the output then passes through the second filter 2 having identical characteristics except that its cut off frequency is N times of that of filter 1. Accordingly, the output from filter 2 is phase distortion free. Although the time axis of the output from the filter 2 is inverted and the duration of the output is condensed, when the output from the filter 2 is sampled and held at a timing of (N-2)th clock pulse, an output same as the input to the filter system can be obtained, except that the output is delayed relative to the input by an interval in which the signal has been stored in the register.

Figure 6:
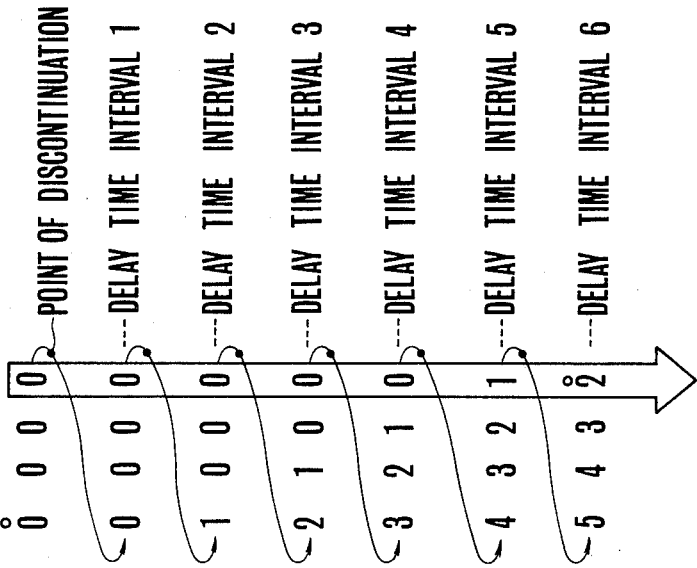
FIG. 6 is a graph for explaining the operations of time axis invension and time axis restoration.

The inversion of the time axis and restoration to the state of the original input are difficult to understand, they will be considered in detail with reference to FIG. 6.

Let us denote data stored in a 5 bit shift register by 1,2,3,4 . . . , starting from the oldest one and denote the data which have previously been stored by 0. When the switching means $S_1$ is switched to the side of the A-D conveter at a timing of (N-1)th (-4th) clock pulse for writing the data into the shift register, the contents of the shift register at the timings of $(N-1)_1$, $(N-1)_2$, $(N-1)_3$ . . . are shown by FIG. 6a. The shift register produces an output by being shifted by the clock pulse sent from the timing circuit irrespective of the fact whether the switching means $S_1$ is thrown to the register side for causing the content thereof to circulate or the switching means $S_1$ is thrown to the A-D converter side for writing the data into the shift register. In consequence, as shown in FIG. 6b, a series of data is produced by the shift register, which series proceeds from $0(\mathring{0})$ to $2(\mathring{2})$ on the actual time axis base (as actual time elapses) in accordance with the content of the shift register as shown in FIG. 6a. Of course $\mathring{0}$ is the oldest output data and $\mathring{2}$ is the newest output data. With regard to an output of a delay time interval, for example the output 4321 within the delay time interval 5, as can be readily understood from the lapse of the actual time mentioned just above, 4 is the oldest data and 1 is the newest data in this time interval so that a result is obtained as if the data were written in the order of 4,3,2 and 1. Actually, however, the data are written into the shift register in the order of 1,2,3 and 4, so that the time axis is inverted with respect to the data within this delay time interval. The same is true for the output data within all other delay time intervals, so that the shift register produces outputs with their time axis inverted and having points of discontinuity at a period of (N-1)th clock pulse.

Let us consider output "1" for example, among various data shown in FIG. 6b, data "1" is first generated within the delay time interval 2, then generated within delay time interval 3 at a time later by the bit N(=5) of the shift register, and then successively generated within delay time intervals 4 and 5. In this manner, the duration of theinput "1" is condensed by N on the output side of the shift register. This is also true for other data "2", "3", "4" . . . . For this reason, it is necessary to make the cut off frequency of the second filter 2 to be N times of that of the first filter 1.

In order to restore the output whose times axis has been inverted as above described after passing it through the A-D converter and the second filter, it is necessary to sample and hold the output at a period of (N-2)th clock pulse as shown by a thick arrow shown in FIG. 6b. It will be clear that the data 1,2 and 3 are sampled within the delay time intervals, 4, 5 and 6 respectively in the order mentioned, that is in the order of applying the input signals to the filter system. For the purpose of avoiding the influence of the transient response when the points of discontinuity pass through the second filter 2, it is advantageous to sample and hold the data at an (N-2)th clock pulse immediately prior to the (N-1)th timing point which is most remote along the time axis.

One example of a phase distortion free analogue filter system of the product type and shown in FIG. 5 will now be described with reference to FIGS. 7 through 10 and FIGS. 11A and 11B.

Figure 7:
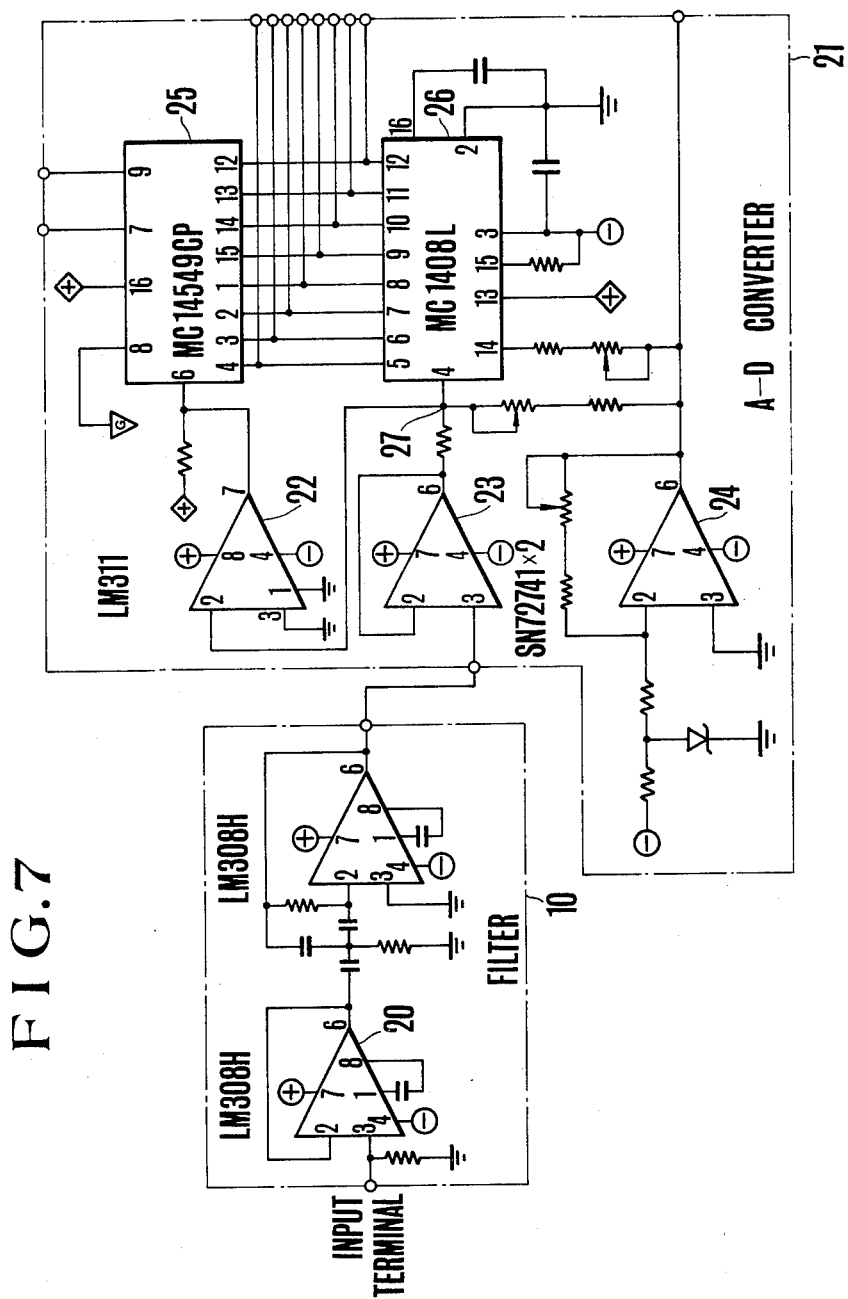
Figure 11:
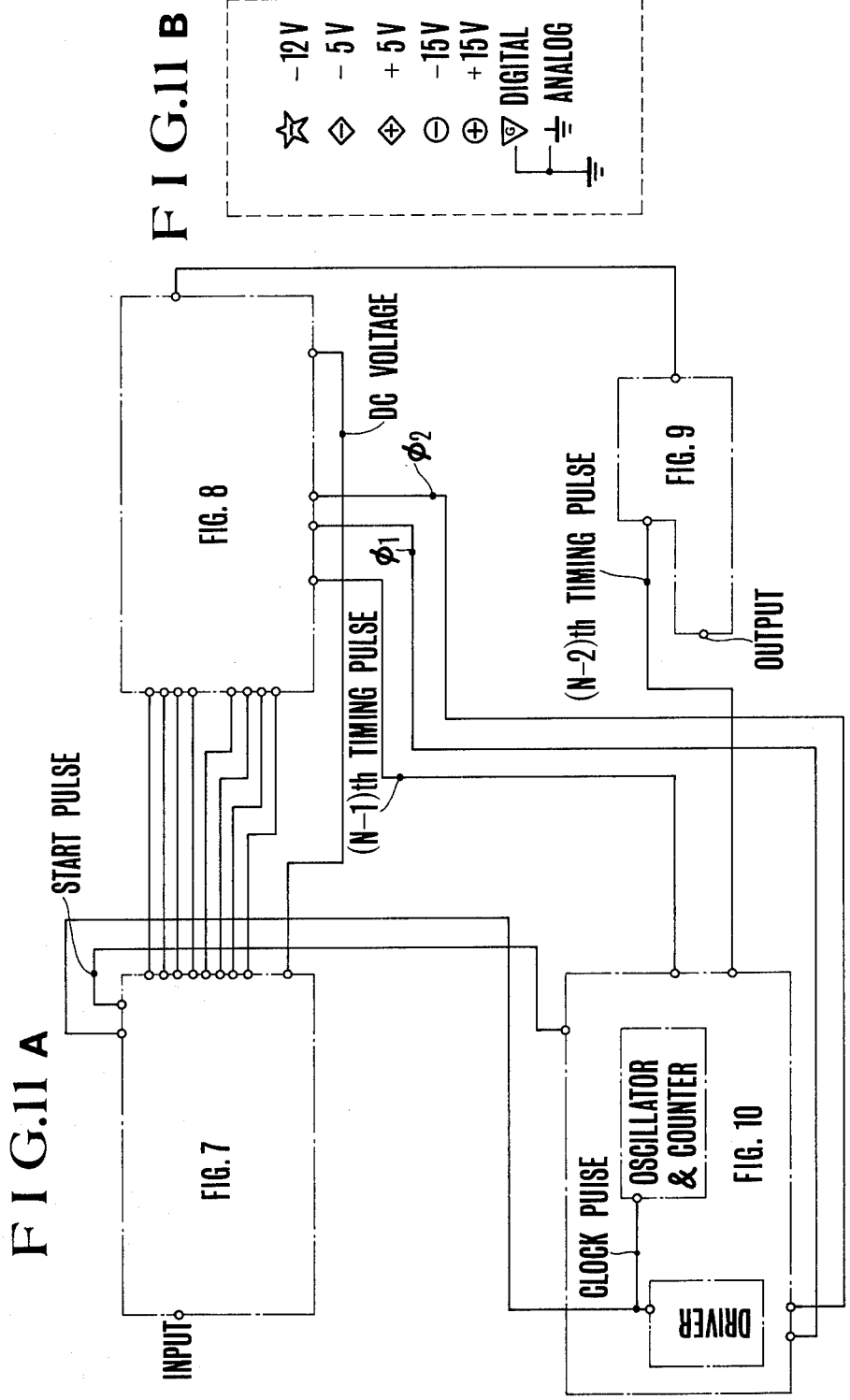
FIG. 11A shows the mutual connection of the circuits shown in FIGS. 7 to 10.
FIG. 11B shows the symbols utilized in the circuits shown in FIGS. 7 to 10.
Figure 12:
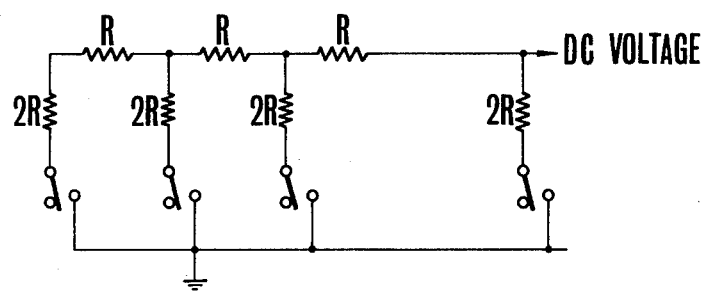
FIG. 12 is a connection diagram showing the essential elements of the A-D converter shown in FIG. 7.

A filter 10 shown in FIG. 7 is a so called high pass multiple feedback (MFB) type active filter provided with a buffer amplifier 20 in the first stage. The buffer amplifier 20 of the high pass filter 10 is preferably of the operational amplifier of LM308H manufactured by National Semiconductor Corp. and connected as shown. A capacitor is connected across terminals 1 and 8 of the amplifier for preventing oscillation. A-D converter 21 of the successive comparison type comprises a comparator 22 of LM311, a buffer amplifier 23 of SN72741, a combined voltage stabilizer and adjuster 24 of SN72741, an A-D controller 25 of MC14549CP, and a D-A converter 26 of MC1408L. LM311 represents an analogue comparator made of National Semiconductor Corp., SN72741 an operational amplifier made of Texas Instrument Co., and MC14549CP and MC1408L are made of Motorola Co. The terminals of these elements are connected as shown. The A-D controller 25 of MC14549CP carries out digital controlling and memory function necessary for the successive comparison A-D conversion and comprises an 8-bit register. The D-A converter 26 of MC1408L comprises a ladder network constituted by a number of resistors R and 2R and a plurality of switches as shown in FIG. 12 in which current can be obtained according to the weight determined by the resistors R and 2R by selectively operating the switches, while being supplied with a DC reference voltage of +5 volts, for example from the combined voltage stabilizer and adjuster 24. Consequently, the current from the buffer amplifier 23 and the current from the D-A converter 26 flow to a common juncture 27 and accordingly, the comparator 22 supplied with a reference voltage of the ground potential operates to sequentially set resistors R and 2R of the D-A converter 26 such that the potential at the juncture 27 will be zero. In this manner, there is obtained an 8-bit binary signal corresponding to the analogue signal and having the most significant bit(MSB) at the terminal 4 of the A-D controller 25 and the least significant bit (LSB) at the terminal 12 thereof. As shown in FIG. 11A, the terminals 7 and 9 of the A-D controller are supplied with a clock pulse and a start command pulse, respectively, from the timing circuit and the terminals designated by triangular and diamond sysbols are supplied with a voltage or connected as shown in FIG. 11B.

Figure 8:
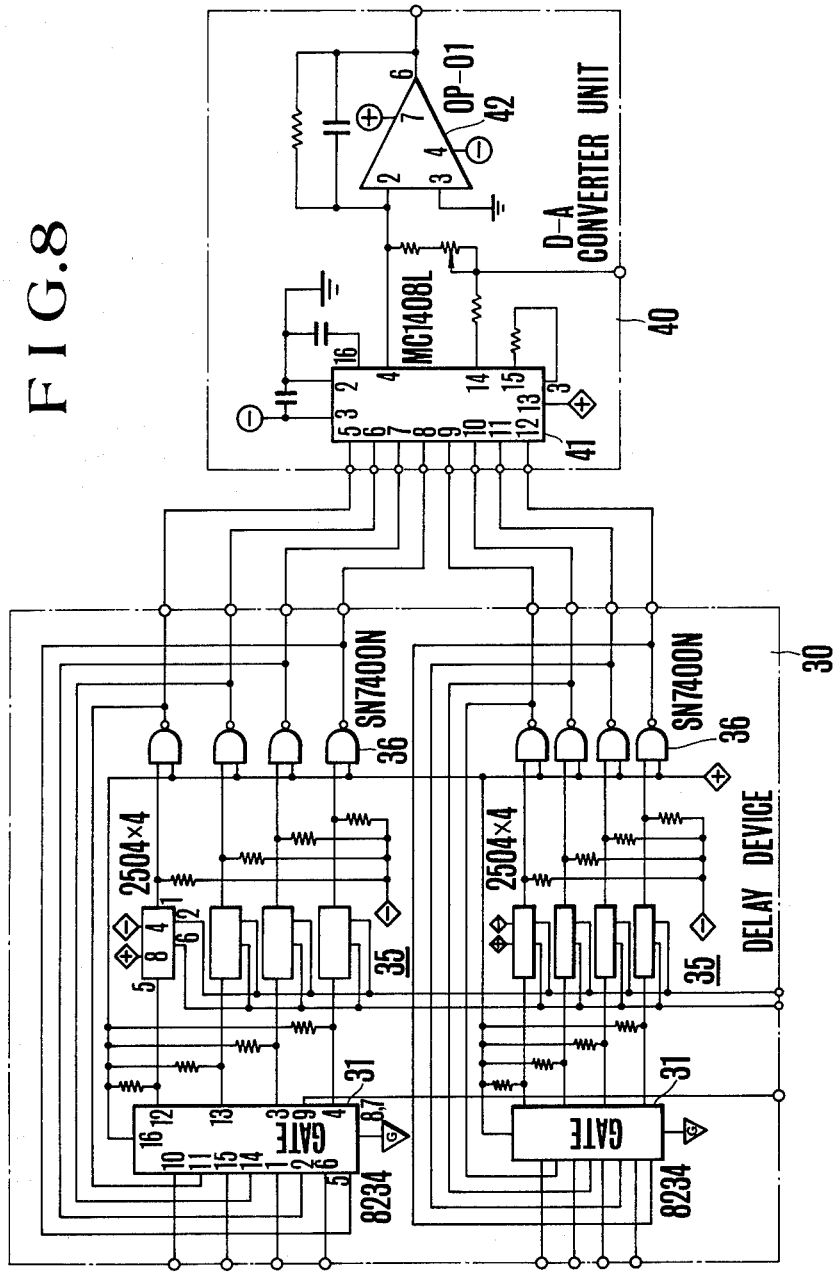
FIG. 8 a delay device (digital memory) and a D-A converter unit.
Figure 13:
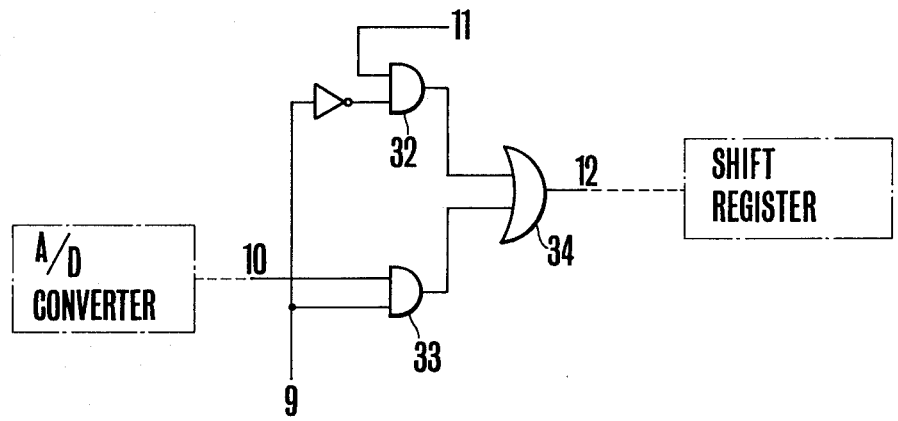
FIG. 13 is a connection diagram showing the detail of the gate circuit shown in FIG. 8.

As shown in FIG. 8 the delay device 30 comprises a pair of gate circuits 31 of 8324 made of Signetic Corp. and operating as the transfer switch $S_1$ shown in FIG. 5. Each one of the terminal pairs 10 and 11; 15 and 14; 1 and 2; and 6 and 5 of each gate circuit 31 corresponds to one bit while terminals 11,14, 2 and 5 are used for the circulation purpose. Terminals 12,13, 3 and 4 are output terminals corresponding to that terminal pairs respectively. As shown in FIG. 11A, terminal 9 of the gate circuit 31 is connected to receive an (N−1)th timing pusle from the timing circuit. The mutual connection of terminals 10, 11,12 and 9 of the gate circuit 31 related to the most significant bit is shown in FIG. 13. The same relation holds true for the mutual connection of the terminals related to other bits. An AND gate circuit 32 shown in FIG. 13 is enabled by the low level of the (N−1)th timing pulse whereas an AND gate circuit 33 is enabled by the high level of the (N−1)th timing pulse. Consequently, during an interval in which the (N−1)th timing pulse is not produced, a signal circulates, together with being applied to the shift register, from terminal 11 to terminal 12 via the AND gate circuit 32 and an OR gate circuit 34. But when the (N−1)the timing pulse is produced, the AND gate circuit 32 is disenabled whereas the AND gate circuit 33 is enabled so that the output signal from the A-D converter is supplied to the shift register via terminal 10, AND gate circuit 33, OR gate circuit 34, and terminal 12. Resistors for determining the operating point of the gate circuit 31 are connected between the source terminal (⊕) and respective output terminals of the gate circuit 31.

The delay device 30 also comprises two sets of four 1024 bit dynamic shift registers 35 of 2504 made of Signetics Corp. As shown in FIG. 11A, terminals 6 and 2 of each shift register are connected to respectively receive pulse trains $\phi_1$ and $\phi_2$. As will be described later, a shift pulse is formed by compounding pulse trains $\phi_1$ and $\phi_2$. Terminal 1 of each shift register is connected to a resistor which determines the operating point.

As has been described hereinabove, as the number of bits of this example is $2^8 = 256$, the resolution of the A-D converter is equal to 10 volts/256 ≈ 40 milli volts.

Assuming a repetition frequency of 200KH for the clock pulse, its period T is 0.005 ms = 5μs, and since the number N of bits of the shift register is 1024, the interval between successive input data to the register is (N−1) × T = 1023 × 0.005 ≈ 5ms. Accordingly, to circulate N data, 5ms × 1023 = 5 sec. is necessary. This 5 seconds corresponds to the memory time of the shift register.

On the output side of each shift register 35 is connected a 2-input NAND gate ciruit 36 of SN7400N made of Texas Instrument Co.

The inputs of the D-A converter unit 40 are connected to receive digital signal trains whose timing axis have been inverted to an extent within the memory time of the shift register. The D-A converter unit 40 comprises a D-A converter 41 identical to that used in FIG. 7 (MC-1408L, made of Motorola Co.). As shown in FIG. 11A, the DC voltage (+5 volts) of the combined voltage stabilizer and adjuster is applied to the analogue output terminal 4 of the D-A converter 41 through a variable resistor so that the zero adjustment of the analogue output can be provided by the adjustment of this variable resistor, To the output of the D-A converter 41 is connected an operational amplifier 42 of MC1408L made of Precision Monolithic Incorporated, thus completing the D-A converter unit 40. The operational amplifier 42 operates as a current-voltage converter. To have better understanding of the signal appearing at the terminal 6 of the operational amplifier 42, that is the output terminal of the D-A converter unit 40, the waveform of this signal will be discussed hereunder with reference to FIG. 14.

Where the input analogue signal applied to the filter system is a sine wave, the respective memory times or the delay time intervals 1a, 2a and 3a are shown in FIG. 14a. FIG. 14b shows magnified waveforms of these intervals. It will be seen that the time axis is inverted in each interval so that by interconnecting point P on the waveform in the interval 1a and point Q on the waveform in the interval 2a, and by interconnecting point R on the waveform in the interval 2a and point S in the interval 3a, the waveform of the input signal regarding the actual time axis can be obtained.

Figure 9:
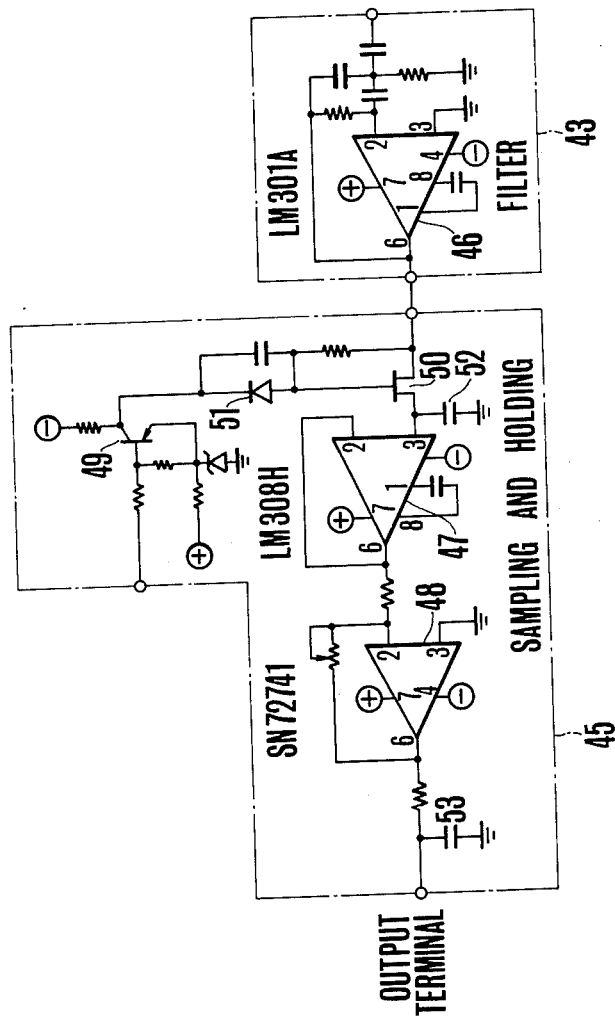
FIG. 9 a second filter and a sampling and holding circuit.

As shown in FIG. 9, a second filter 43 including an operational amplifier 46 of LM301A made of National Semiconductor Corp. is a high pass MFB active filter like the first filter 10 but has a cut off frequency N times of that of the filter 10. The sampling and holding circuit connected to the output of the second filter 43 comprises a buffer amplifier 47 of LM308H, a gain adjuster 48 of SN72741, a switching transistor 49 with its base electrode connected to receive an (N−2)th timing pulse via a resistor as shown in FIG. 11A, a switching field effect transistor 50 with its gate electrode connected to the collector electrode of the switching transistor via a diode 51 and a holding capacitor 52 connected between the ground and the common juncture between the switching field effect transistor 50 and the buffer amplifier 47. Each time that the (N−2) timing pulse which is a negative-going pulse of about +3.2 volts is impressed upon the base electrode of the switching transistor 49, this transistor turns ON to increase the collector potential thereof. In response to this potential rise the switching field effect transistor turns ON to charge the holding capacitor 52. Diode 57 connected between the switching field effect transistor 50 and the switching transistor 59 and a capacitor connected across the diode 57 act to ensure a steady operation of the field effect transistor. The buffer complifier 47 holds the charge stored in the holding capacitor 52. A capacitor 53 connected on the output side of the gain adjusting circuit 48 acts to eliminate noise.

In this manner, across the holding capacitor 52 appears a signal having the same frequency as the input signal to the filter system but always delayed therefrom by the capacity of the shift register.

Figure 10:
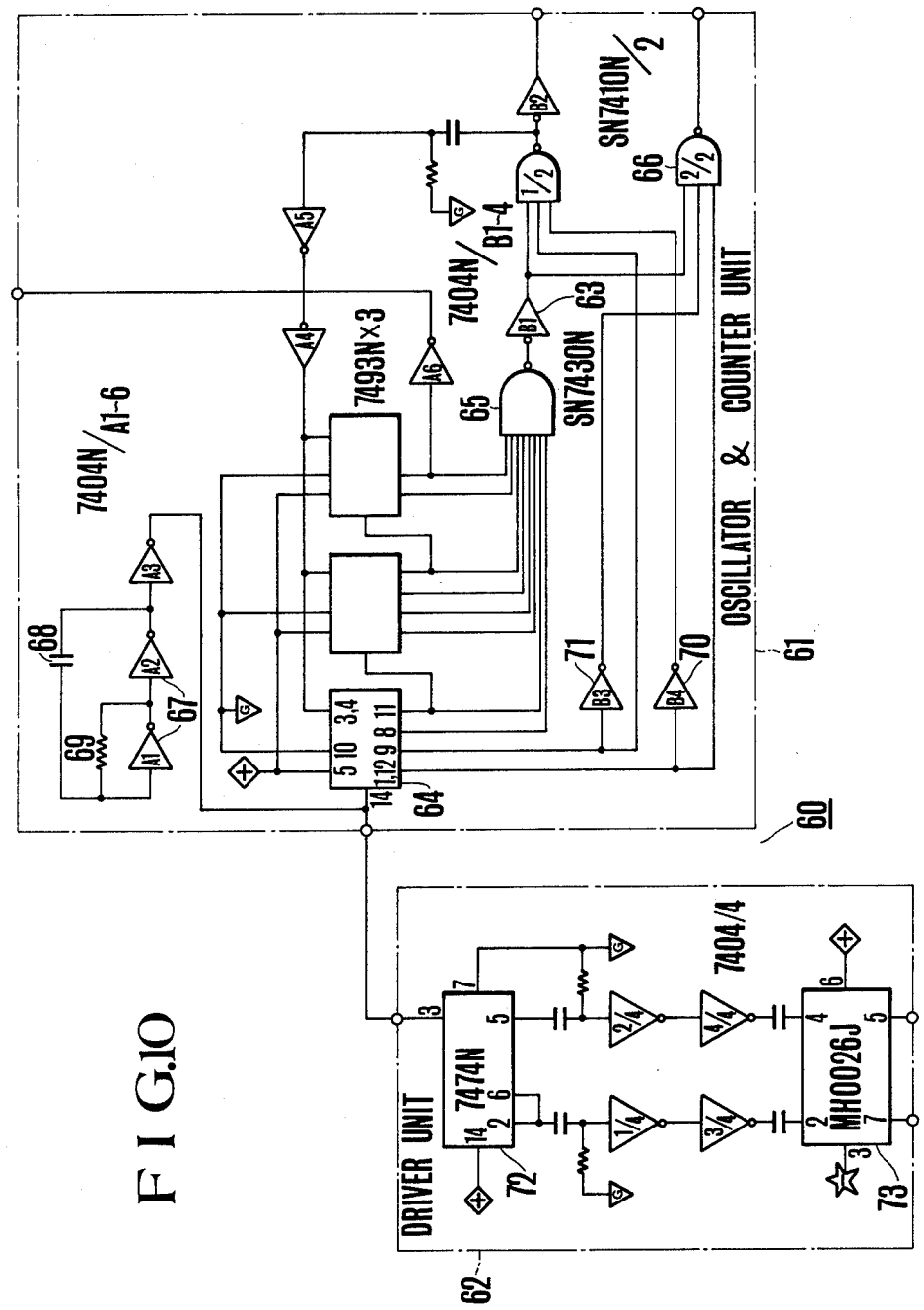
Figure 15:
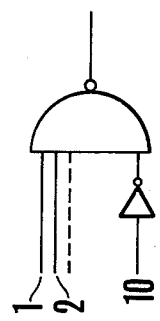
FIG. 15 is a diagram for explaining the operation of the counter shown in FIG. 10.

As shown in FIG. 10, the timing circuit 60 is constituted by an oscillator and counter unit 61 and a driver unit 62. The oscillator and counter unit 61 comprises an inverter 63 of 7404N, three 4-bit binary counters 64 of 7493N, an 8-input NAND gate circuit 65 of SN7430N and a 3-input NAND gage circuit 66 of SN7410N, all made of Texas Instrument Co. Three inverters 67 are connected in series to form a pulse oscillator together with a capacitor 68 and a resistor 69. The output of this oscillator is supplied to the 4-bit binary counter 64 of the first stage, the driver unit 62 and to the clock pulse terminal of the A-D converter as shown in FIG. 11A to act as the clock pulse. The three 4-bit binary counters 64 constitute a counter having a total of 1024 bits which is cleared by an (N−1=1023)th pulse. Where a 10-input AND gate circuit is used as shown in FIG. 15, it is possible to readily obtain the (N−1)th timing pulse by connecting an inverter in series with the 10th input terminal of the AND gate circuit. However, since the NAND gate circuit 65 of SN7430N has only 8 inputs, an inverter 70 is added to cause the NAND gate circuit 65 to operate in the same manner as that shown in FIG. 15. Further, an inverter 71 is provided to cooperate with the 8-input NAND gate circuit 65 for generating an (N−2)th timing pulse.

Figure 16:
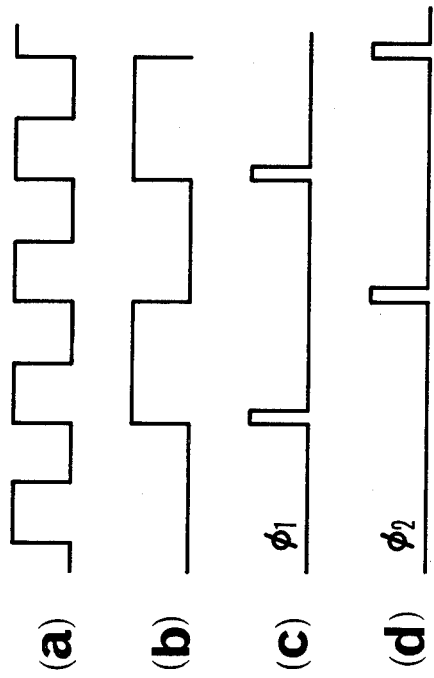
FIG. 16 shows waveforms useful to explain the operation of the driver unit shown in FIG. 10.

The driver unit 62 shown in FIG. 10 comprises a D-type flip-flop circuit of 7474N made of Texas Instrument Co. and a clock driver 73 of MH0026J made of National Semiconductor Corp. The driver unit generates pulse trains necessary to drive the shift register and operates as shown in FIGS. 16a through 16d. More particularly, the clock pulse (FIG. 16a) applied to the terminal 3 of the flip-flop circuit 72 is reduced its repitition frequency to produce a waveform as shown in FIG. 16b. The leading edges of this waveform are differentiated to produce a pulse train $\phi_1$ as shown in FIG. 16c whereas the trailing edges are differentiated and inverted to obtained a second pulse train $\phi_2$ as shown in FIG. 16c. As shown in FIGS. 8 and 11A, these pulse trains $\phi_1$ and $\phi_2$ are applied to respective shift registers to be synthesized thereby to form a shift pulse. Accordingly, the contents of respective shift registers are shifted in synchronism with the clock pulse. The clock driver 73 is connected to receive the pulses $\phi_1$ and $\phi_2$ at its input terminals 2 and 4 respectively for converting the level of these pulses to be suitable for the shaft registers.

Figure 17:
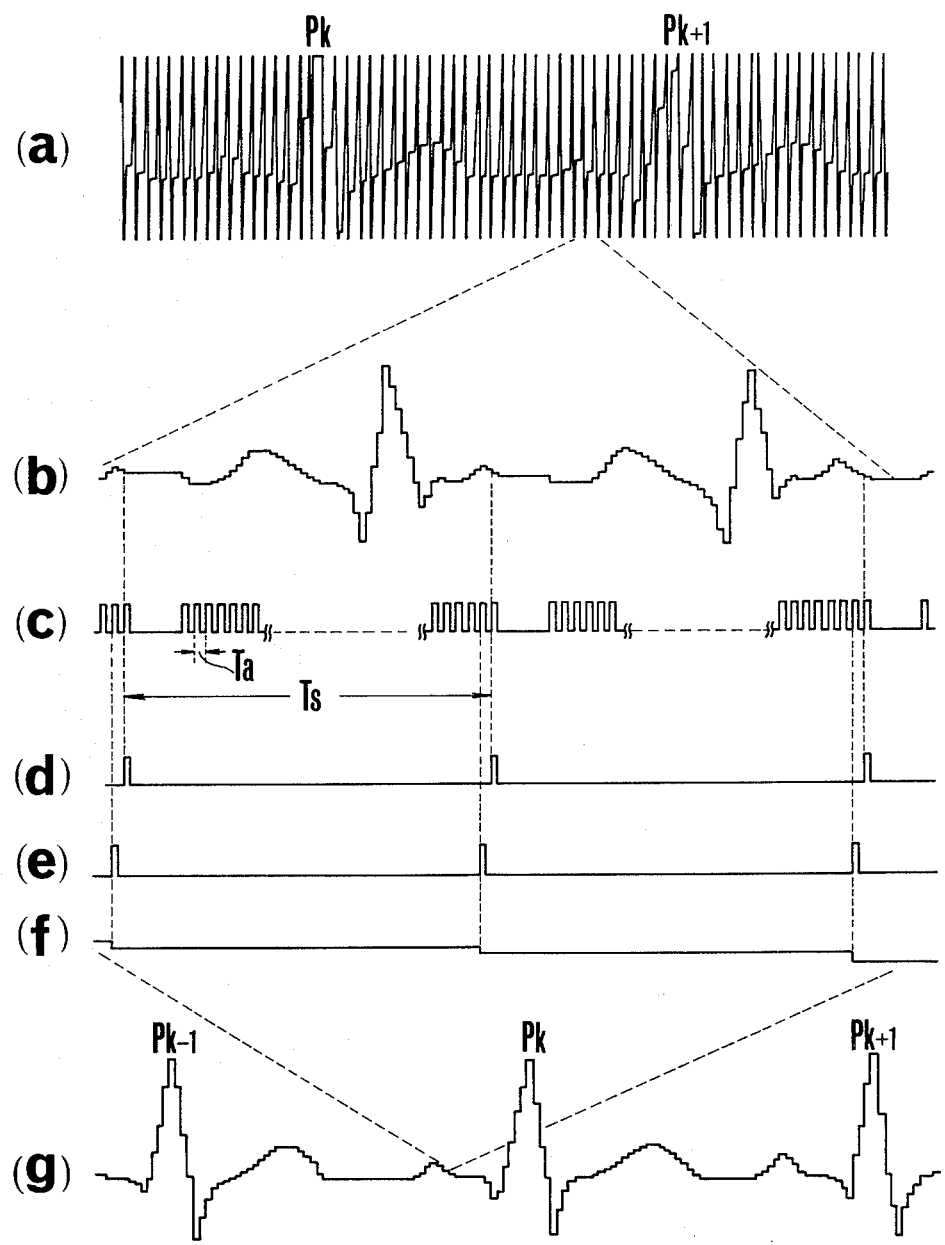
FIGS. 17a through 17g are waveforms showing the relationship between the outputs of the D-A converter unit as well as sampling and holding circuit and various timing pulses.

As the characteristics of the output from the D-A converter unit has already been discussed in connection with FIG. 14, the application of this invention to a cardiogram waveform will now be described briefly with reference to FIG. 17 which shows the relationship between the output of the D-A converter, timing pulses and the output of the sampling and holding circuit. FIG. 17a shows the output waveform of the D-A converter unit which shows that the original signal is sampled, and that between the sampling intervals the time axis is inverted and a condensed signal is interposed between the intervals. FIG. 17b shows an enlarged view of a portion of the waveform shown in FIG. 17a whereas FIG. 17c shows a clock pulse for controlling the shift register. In FIG. 17c, T$a$ represents the read out time from the shift register. FIG. 17d shows the (N−1)th timing pulse in which T$s$ represents the sampling period. FIG. 17e shows the (N−2)th timing pulse that is the sampling and holding pulse utilized to hold the sampled data when the last data is produced by the shift register. FIG. 17f shows a magnified output waveform from the sampling and holding circuit and FIG. 17a shows a waveform whose time axis has been restored to the original.

Figure 18:
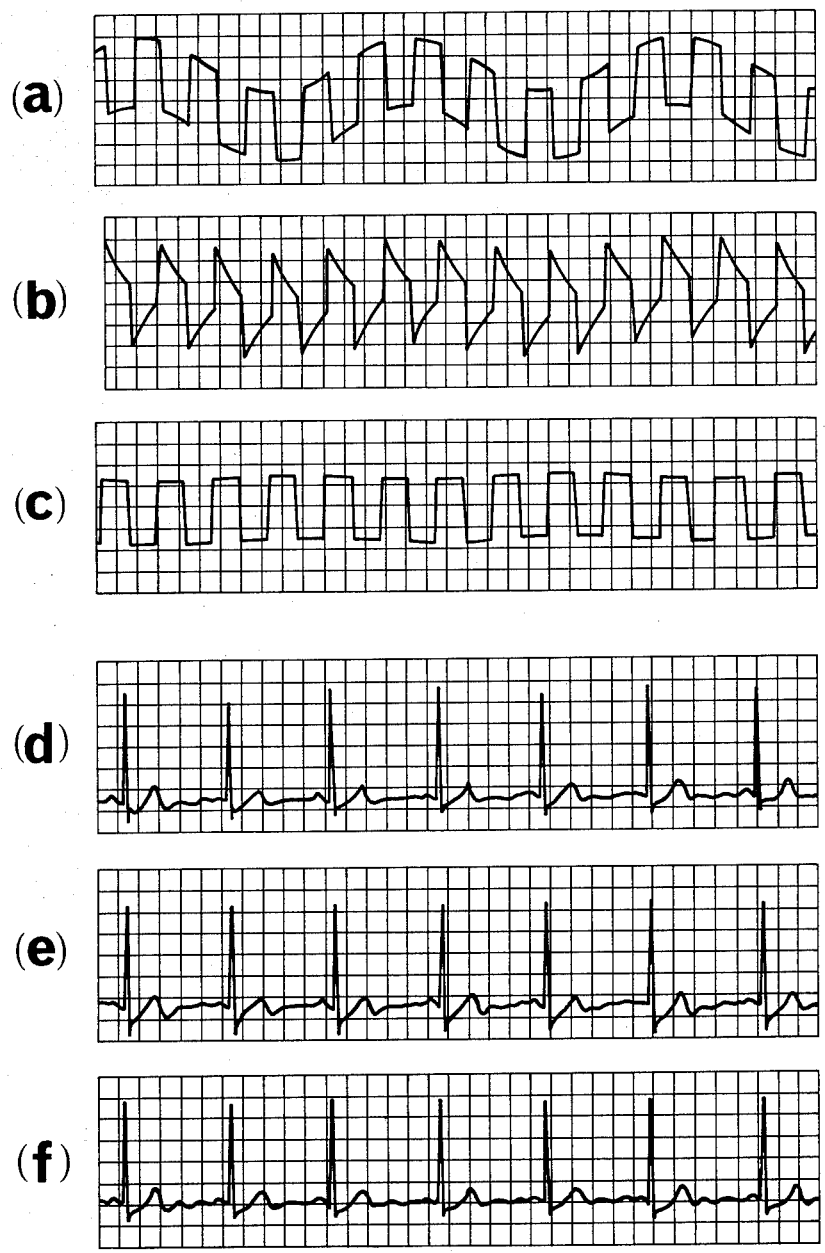
FIGS. 18a through 18f show output waveforms actually obtained by passing an analogue signal through a conventional analogue filter and a novel phase distortion free analogue filter system of this invention.

FIG. 18 shows the result of experiment made on a phase distortion free filter system of the product type and constructed by the circuits described above and including a quadratic type high pass filter 10 having a cut off frequency of 0.8Hz. The cut off frequency of the second filter 43 is increased corresponding to the radio of condensation of the read out data.

FIG. 18a shows the waveform of an input signal consisting of a sine wave (0.4Hz) and a rectangular wave (2Hz) superposed thereon. FIG. 18b shows the waveform of the signal when it is passed through only one quadratic type high pass filter having a cut off frequency of 0.8Hz as in the conventional filter. FIG. 18c shows the waveform of the signal when it is passed through the phase distortion free filter system of this invention. As can be noted from FIG. 18b and 18c, the phase distortion free filter system of this invention can eliminate the low frequency components without any distortion of the waveform.

FIG. 18d shows the waveform of a cardiogram signal, and FIG. 18e shows the waveform thereon when it is passed only through the above-mentioned linear filter. FIG. 18f shows the waveform of the cardiogam signal when it is passed though the phase distortion free filter system of this invention, showing that the output signal is substantially equal to the original cardiogram signal and that base fluctuation has been eliminated.

Figure 19:
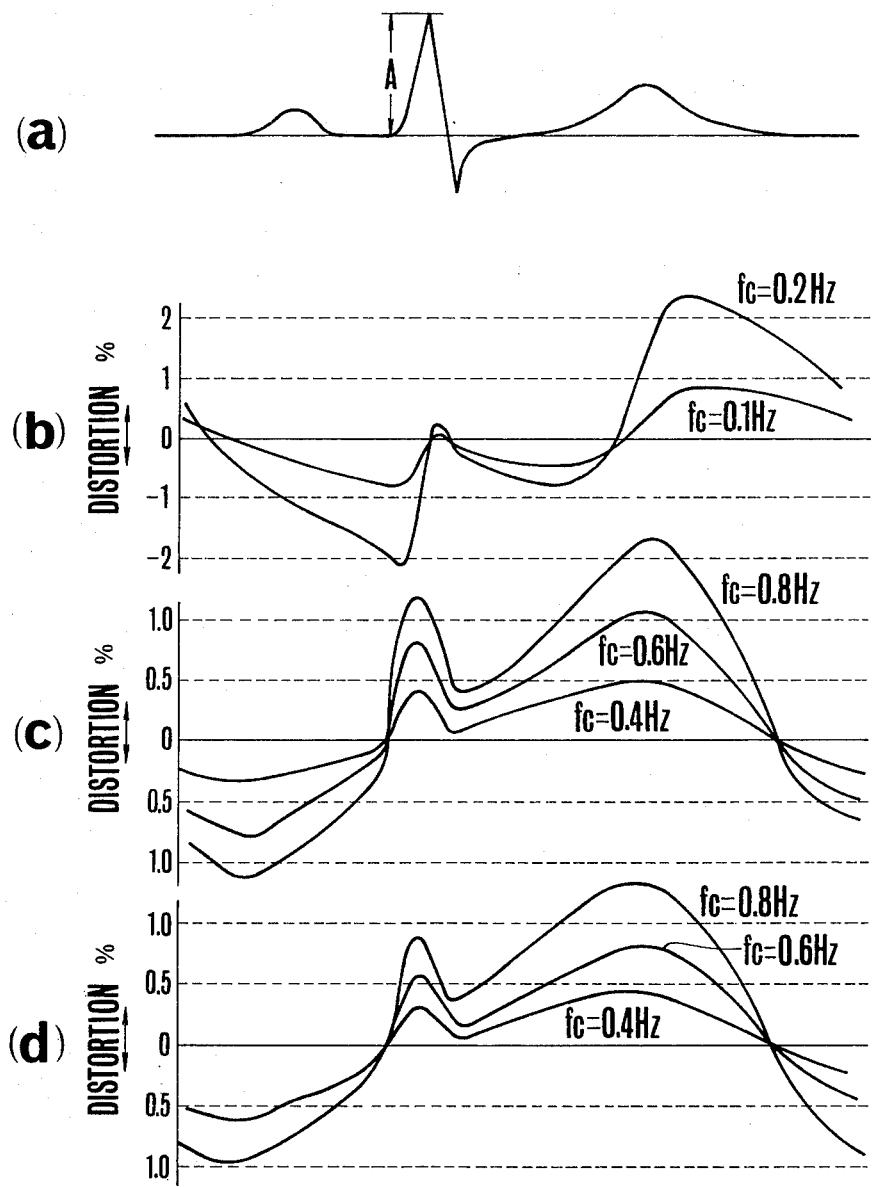
FIGS. 19a through 19d are graphs showing the amount of distortion of the output waveform where a cardiogram is utilized as an input signal.

FIG. 19 shows the percentage distortion of the output waveform in which FIG. 19a shows the original cardiogram signal, and FIG. 19b shows the percentage distortion of the original signal when it is passed through only on quadratic type analogue filter as in the conventional manner. FIG. 19c shows the percentage distortion of the original signal when it is passed through a phase distortion free filter system having a transmission function of H$a$(S) and FIG. 19d shows the percentage distortion of the original signal when it is passed through a phase distortion free filter system having a transmission function of H$m$(S), where $$Ha(S) = S^2(S^2 + \omega_c^2)/(S^2 - \omega_c^2)^2$$

$$Hm(S) = S^4/(S^2 - \omega_c^2)^2$$

percentage distortion = $(\Delta A/A) \times 100\%$ in which ΔA represents the difference between the amplitude A of the original signal and that of the filter output at an optional time.

As can be noted from the result of experiment described above, reading of the waveform of a biological signal is difficult because the frequency components extends to relatively low frequency regions and because the base line fluctuates due to the characteristics of the measuring instrument.

Use of a high pass analogue filter for the purpose of eleminating the base line fluctuation is not advantageous because phase distortion occurs. Use of the zero level of adjacent signal waves for the purposes of linear approximation is effective only for portions where the base line fluctuates very slowly, especially, almost linearly. If subjected to a minicomputer, the low cut off frequency waveforms encounters difficulties for the real time processing. The novel filter system of this invention can solve all of these problems.

Figure 20:
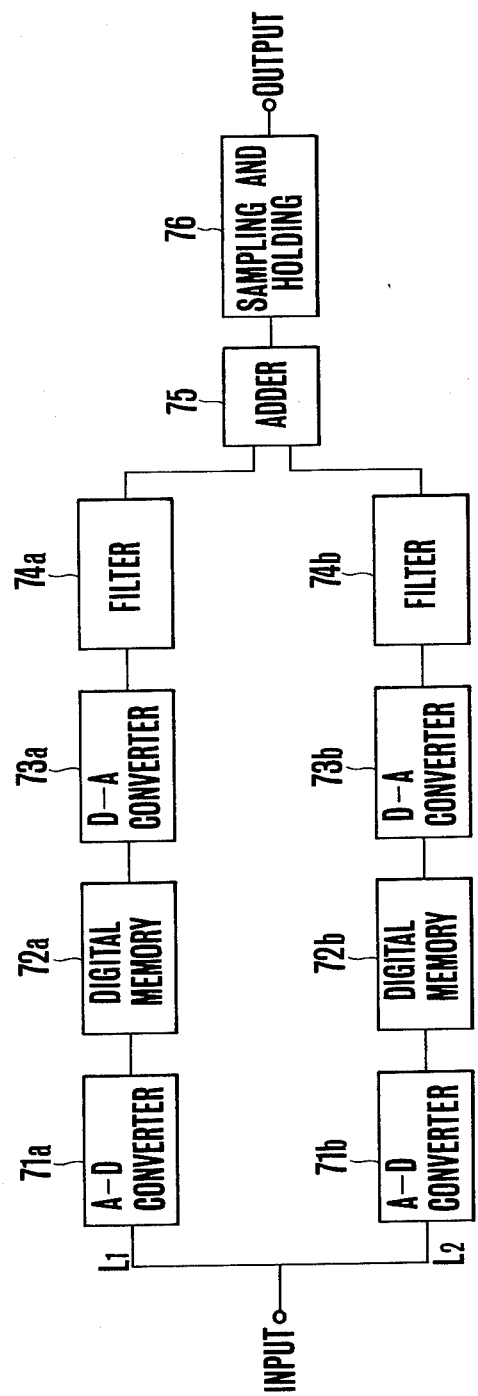
FIG. 20 is a block diagram of one embodiment of the phase distortion free filter system of this invention of the additive type.

The phase distortion free filter system of the additive type having a transmission function Ha(S) expressed by equation (1) can be constructed by using conventional analogue filters, a digital memory circuit (delay device) and an adder, as shown in FIG. 20. Thus, the input signal passes through a pair of branch circuits $L_1$ and $L_2$. In the branch circuit or channel $L_1$ the input signal passes through an A-D converter 71a, and then stored in a digital memory device 72a. When read out from the digital memory device, the time axis of the signal is inverted and condensed, and the read out signal is then applied to an analogue filter 74a via a D-A converter 73a. In the branch circuit L2, the signal is stored in a digital memory device 72b via an A-D converter 71b. When read out from the digital memory device 72a, the signal is delayed by a time sufficient to assure the impulse response of the filter system and then sent to an analogue filter 74b through a D-A converter 73b. The signal components passing through both filters 74a and 74b are added with each other by an adder 75 and its time axis is restored to the original state by a sampling and holding circuit 76. The sampled output is held by the circuit 76.

Figure 21:
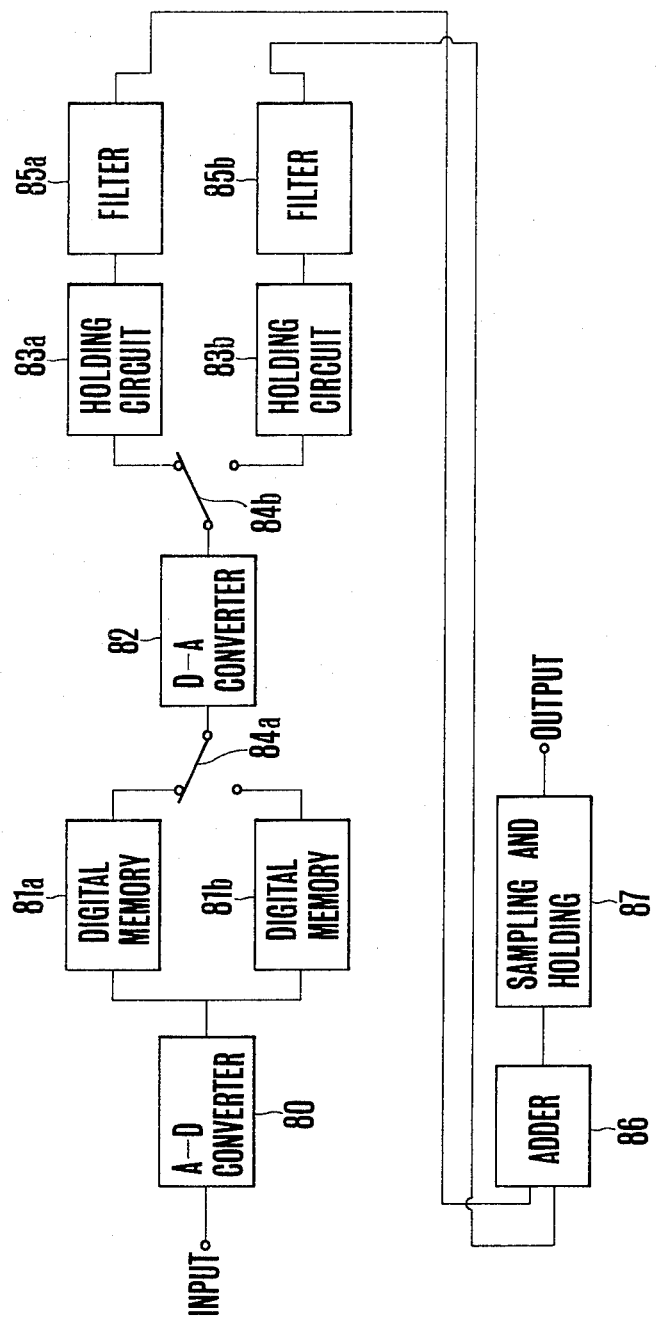
FIG. 21 is a block diagram showing a modified phase distortion free filter system of the additive type.

The filter system can also be constructed as shown in FIG. 21 for the purpse of decreasing the number of the A-D and D-A converters. Thus, an input signal is converted into a digital signal by an A-D converter 80 and the same content is stored simultaneously in parallelly connected digital memory devices 81a and 81b. When read out from the memory device 81c, the time axis is inverted and condensed. However, when read out from the memory devices 81b, the signal is merely delayed by a time sufficient to assure the impulse response of the filter system. For this reason, the memory device 81b may be a simple shift register. The outputs from the memory devices 81a and 81b are switched alternately during the sampling period by a transfer switch 84a connected to a D-a converter 82. The output from this D-A converter is supplied alternately to serially connected holding circuit 83a and filter 85a and to serially connected holding circuit 83b and filter 85b via a transfer switch 84b. The outputs of the holding circuits 85a and 85b are applied to a sampling and holding circuit 87 via an adder 86 to produce a final output signal. Compared with the system shown in FIG. 20, the system shown in FIG. 21 can eliminate one A-D converter and one D-A converter thus simplifying the construction and reducing the manufacturing cost.

While the invention has been shown and described in terms of some preferred embodiments, it should be understood that many changes and modifications will be obvious to one skilled in the art without departing from the spirit and scope of the invention as defined in the appended claims.

What is claimed is:

1. An analogue filter system comprising a first analogue filter connected to an input terminal for receiving an input analogue signal, a second analogue filter having similar characteristics to the first analogue filter, delay means connected between the first and second analogue filters for storing the output from said first analogue filter and for producing an output with the time axis thereof inverted under the control of a timing circuit, and means for restoring the inverted time axis of said output, whereby an output analogue signal is produced which is delayed in relation to said input analogue signal but free from any phase distortion.

2. The analogue filter system according to claim 1 which further comprises an analogue-digital converter interposed between said first analogue filter and said delay means, and a digital-analogue converter interposed between said delay means and said second analogue filter.

3. An analogue filter system comprising:
a first analogue filter connected to an input terminal for receiving an input analogue signal;
a second analogue filter having similar characteristics to the first analogue filter;
a first analogue to digital converter for receiving an output signal from said first analogue filter;
delay means connected to an output of said analog to digital converter for storing the output from said first analogue filter and for producing an output with the time access thereof inverted under the control of a timing circuit, said delay means comprising a N-bit (N being an integer) shift register and a first switching means adapted to be transferred between a first position at which the output of said shift register is fed back to the input thereof and a second position at which said shift register receives the output from said analogue to digital converter, said first switching means being normally thrown to said first position but thrown to said second position in response to an (N-3)th timing pulse from said timing circuit;
a digital to analogue converter for receiving an output signal from said delay means; and
means for restoring the inverted time access of an output signal of said digital to analog converter, said means for restoring the time access comprising second switching means interposed between said second analogue filter and the output terminal of said filter system, and a capacitor on the output side of said second switching means, said second switching means being normally held open but closed in response to an (N-2)th timing pulse from said timing circuit, whereby an output analogue signal is produced which is delayed in relation to said input analogue signal but free from any phase distortion.

4. The analogue filter system according to claim 3 which further comprises means for operating said A-D converter in synchronism with the shifting operation of said N bit shift register.

5. The analogue filter system according to claim 1 wherein said second analogue filter has a cut off frequency characteristics N times of that of the first analogue filter.

6. The analogue filter system according to claim 4 wherein said A-D converter is operated by a clock pulse from said timing circuit, and said shift register is operated by a compound pulse train produced by synthesizing first and second pulse trains generated by said clock pulse through a drive circuit.

7. The analogue filter circuit according to claim 6 wherein said drive circuit comprises a flip-flop circuit supplied with said clock pulse, means for differentiating the leading edge of the output from said flip-flop circuit for producing said first pulse train and means for differentiating and inverting the trailing end of the output from said flip-flop circuit for producing said second pulse train, said first and second pulse trains being synthesized by said shift register.

8. The analogue filter system according to claim 3, wherein said first switching means comprises an integrated circuit and said second switching means comprises a combination of a transistor and a field effect transistor.

9. An analogue filter system comprising an input terminal for receiving an input analogue signal, a first analogue filter channel including means for inverting and condensing the time axis of said input analogue signal, a second analogue filter channel connected in parallel with said first analogue filter channel and including means for delaying said input analogue signal, an adder for adding with each other the outputs from said first and second analogue filter channels, and a sampling and holding circuit connected to the output of said adder for restoring the time axis thereof.

10. The analogue filter system according to claim 9 wherein said first analogue channel comprises an A-D converter, a digital memory device for storing the digital output of said A-D converter, said digital memory device including means for inverting and condensing the time axis of the digital signal read out therefrom, a D-A converter for effecting D-A conversion of the digital signal read out from said digital memory device, and an analogue filter connected to the output of said D-A converter and wherein said second analogue channel comprises similar elements to said first analogue channel except that said digital memory device includes means for delaying the digital signal read out therein for a time sufficient to assure impulse response of the filter system.

11. An analogue filter system comprising an analogue input terminal; a single A-D converter connected to said analogue input terminal; a first channel including means for inverting and condensing the digital output from said A-D converter; a second channel connected in parallel with said first channel and including means for delaying the digital output of said A-D converter; a first analogue filter channel including holding means corresponding to said first channel; a second analogue filter channel including holding means corresponding to said second channel: a single D-A converter; switching means for alternately connecting said D-A converter between said first channel and said first analogue filter channel and between said second channel and said second analogue filter channel; an adder for adding with each other the outputs of said first and second analogue filter channels; and a sampling and holding circuit connected to the output of said adder for restoring the time axis of the analogue signal.

* * * * *